(12) United States Patent
Nagy et al.

(10) Patent No.: US 8,449,002 B2
(45) Date of Patent: May 28, 2013

(54) CLOSURE MECHANISM FOR PRESSURE TEST CHAMBERS FOR TESTING ELECTRONIC COMPONENTS, IN PARTICULAR ICS

(75) Inventors: Andreas Nagy, München (DE);
Maximilian Schaule, Mindelheim (DE);
Manfred Eibl, Lamprechtshausen (AT);
Stefan Kurz, Rosenheim (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 182 days.

(21) Appl. No.: 12/668,265

(22) PCT Filed: Jul. 1, 2008

(86) PCT No.: PCT/EP2008/005368
§ 371 (c)(1),
(2), (4) Date: Jan. 8, 2010

(87) PCT Pub. No.: WO2009/007043
PCT Pub. Date: Jan. 15, 2009

(65) Prior Publication Data
US 2010/0193520 A1 Aug. 5, 2010

(30) Foreign Application Priority Data
Jul. 12, 2007 (DE) .......................... 10 2007 032 559

(51) Int. Cl.
*B65D 48/00* (2006.01)
*B65D 45/30* (2006.01)
*E05B 65/00* (2006.01)

(52) U.S. Cl.
USPC .......................... 292/256; 292/256.5; 292/257

(58) Field of Classification Search
CPC ........................ E05B 73/0017; E05B 17/0025
USPC .................. 292/256, 256.5, 256.75, 257, 258
See application file for complete search history.

(56) References Cited

U.S. PATENT DOCUMENTS

| | | |
|---|---|---|
| 3,195,761 A | 7/1965 | Coats |
| 3,406,997 A | 10/1968 | Wilcox et al. |
| 3,441,166 A * | 4/1969 | De Frees .................... 220/324 |

(Continued)

FOREIGN PATENT DOCUMENTS

| | | |
|---|---|---|
| DE | 188 927 | 9/1907 |
| DE | 870 621 | 3/1953 |

(Continued)

OTHER PUBLICATIONS

International Search Report for PCT/EP2008/005368, mailed Jan. 29, 2009.

*Primary Examiner* — Thomas Beach
*Assistant Examiner* — Nathan Cumar
(74) *Attorney, Agent, or Firm* — Nixon & Vanderhye, P.C.

(57) ABSTRACT

A closure mechanism for pressure test chambers for testing electronic components, in particular ICs, has a plurality of pivoting jaws. At least some of the pivoting jaws have at least one lifting apparatus which can be advanced to two interacting cavity elements, which surround a cavity, by means of the pivoting jaws. Furthermore, at least some of the pivoting jaws have at least one locking device in order to move spacer elements into an intermediate space between the associated pivoting jaws and the compressed cavity element, as a result of which the tightness of the cavity is maintained even when the lifting apparatuses are retracted.

10 Claims, 4 Drawing Sheets

U.S. PATENT DOCUMENTS

Figure 1:
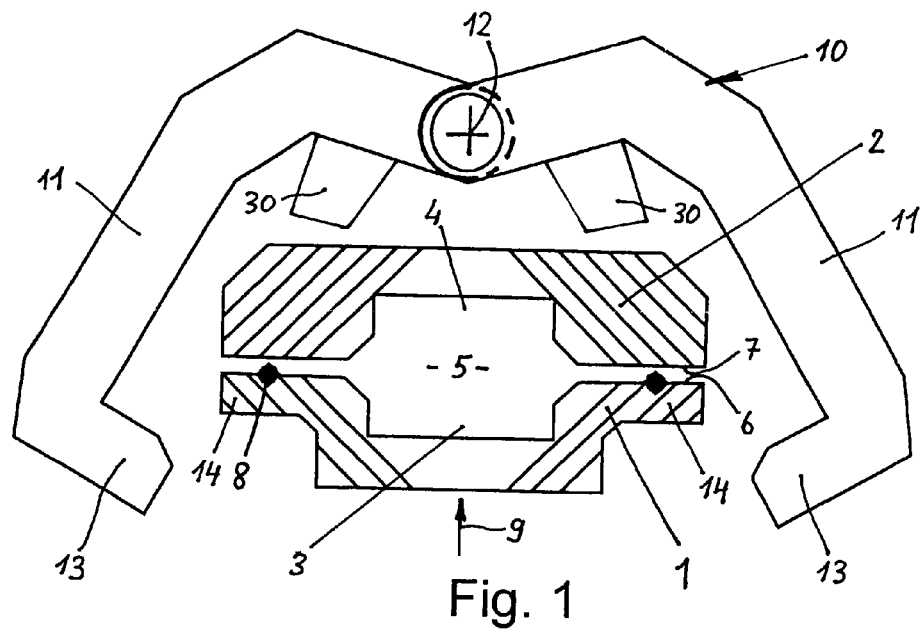

| | | | |
|---|---|---|---|
| 3,458,083 A | 7/1969 | Erwin et al. | |
| 3,514,009 A * | 5/1970 | Davis et al. | 220/324 |
| 3,672,403 A * | 6/1972 | Wilson et al. | 138/89 |
| 3,856,338 A * | 12/1974 | Johnsson | 292/256 |
| 4,157,146 A * | 6/1979 | Svenson | 220/324 |
| 4,438,866 A * | 3/1984 | Gegaregian et al. | 220/319 |
| 4,809,873 A * | 3/1989 | Fossey | 220/324 |
| 5,269,573 A * | 12/1993 | Rear | 292/257 |
| 5,290,076 A * | 3/1994 | Smith | 292/25 |
| 5,294,157 A | 3/1994 | Smith et al. | |
| 5,333,653 A * | 8/1994 | Rzesutock et al. | 141/1 |
| 6,595,716 B1 * | 7/2003 | VanDeVyvere et al. | 404/26 |
| 2002/0079882 A1 | 6/2002 | Okudaira et al. | |
| 2006/0244472 A1 | 11/2006 | Hayashi et al. | |

FOREIGN PATENT DOCUMENTS

| | | |
|---|---|---|
| DE | 1 177 882 | 9/1964 |
| DE | 22 60 411 | 1/1975 |
| DE | 199 17 917 | 11/2000 |
| DE | 100 16 805 | 10/2001 |
| DE | 101 02 414 | 7/2002 |
| EP | 1 222 888 B1 | 1/2002 |
| FR | 2 580 364 | 10/1986 |
| GB | 1 229 489 | 4/1971 |
| GB | 2 397 359 | 7/2004 |
| JP | 2000-320675 | 11/2000 |
| WO | WO 01/42688 | 6/2001 |

* cited by examiner

CLOSURE MECHANISM FOR PRESSURE TEST CHAMBERS FOR TESTING ELECTRONIC COMPONENTS, IN PARTICULAR ICS

This application is the U.S. national phase of International Application No. PCT/EP2008/1005368 filed 1 Jul. 2008, which designated the U.S. and claims priority to German Application No. DE 10 2007 032 559.4 filed 12 Jul. 2007, the entire contents of each of which are hereby incorporated by reference.

The invention relates to a closure mechanism for pressure test chambers for testing electronic components, in particular ICs, under specific pressure conditions, according to the preamble of claim 1.

Electronic components such as MEMS (Micro-Electro-Mechanical Systems), which are used to determine pressure, are conventionally subjected to pressure tests after manufacture to check they are functioning correctly or to equalise, i.e. calibrate, the functional characteristic thereof at different temperatures. To achieve this, it is sometimes necessary to determine a plurality of parameters. The pressure tests take place in pressure test chambers which are formed from two cavity members which can be separated from one another. The components to be tested are in this case placed in the cavity of a cavity member, whereupon said cavity member is moved against the other cavity member until it contacts said other cavity member tightly. At this point, contact points of the components are connected to electrical contacts leading to an electronic test means. The pressure at which the tests are to be carried out is then produced in the cavity. Once the tests have been completed, the cavity members are moved away from one another to allow the components to be removed from the cavity and sorted according to the test results. The components are expediently conveyed to and removed from the cavity by a handler, i.e. an automatic handling machine which loads and unloads the components at high speed.

Since the tests are often carried out at high pressure of 20 bar or greater, it is necessary for the cavity members to be held together by a closure mechanism which ensures that the cavity remains tight even at high pressure, as it would not otherwise be possible to maintain constant pressure conditions within the cavity. Furthermore, a closure mechanism of this type should be of simple construction and suitable for high loading and unloading speeds. Current closure mechanisms often do not satisfy these requirements.

The object of the invention is therefore to produce a closure mechanism for pressure test chambers for testing electronic components, in particular ICs, which also ensures that the cavity remains tight, even at high pressure, is of a simple construction and is suitable for high loading and unloading speeds.

This object is achieved according to the invention by a closure mechanism having the features of claim 1. Advantageous embodiments of the invention are disclosed in the sub-claims.

The closure mechanism according to the invention is characterised by the following features:
  the closure mechanism comprises a plurality of pivoting jaws which can be pivoted between a closed position and an open position,
  at least a part of the pivoting jaws has at least one lifting device which can be advanced towards one of the cavity members by the pivoting jaws so as to be able to press said cavity member against the other cavity member by means of the lifting devices in the closed position of the pivoting jaws,
  at least a part of the pivoting jaws has at least one locking means with which a spacer member can be moved into a gap between the pivoting jaws and the pressed cavity member in such a way that the pressed cavity member remains in tight contact with the other cavity member even when the lifting device has been retracted.

The closure mechanism according to the invention enables the two cavity members to be pressed against one another in a very secure, simple and fast manner and held in tight contact. It is possible to initially bring one of the cavity members, after loading with one or more components, into the direct vicinity of the other cavity member very rapidly using a known device. The pivoting jaws are subsequently pivoted into the closed position thereof. The process of pressing the cavity member further against the other cavity member is carried out by the lifting devices which are arranged in at least a part of the pivoting jaws. Since it is only necessary for these lifting devices to cover short lifting paths, they can have a correspondingly small construction. The pressing force to be applied to the cavity member can in this case be divided correspondingly by providing a corresponding plurality of lifting devices. In this way, a sealing ring present around the cavity in the region of the gap between the two cavity members is compressed correspondingly. By introducing the spacer members into the gap produced by the lifting devices between the pressed cavity member and the pivoting jaws, the pressed position of the cavity member is always retained in such a way that a secure seal is maintained between the cavity members, even when the lifting devices are retracted. In this way, the high pressure in the lifting devices need not be maintained during the entire test process but can be reduced immediately after the spacer members have been inserted.

In an advantageous embodiment, the pivoting jaws are C-, L- or U-shaped. This makes it possible to mount the pivoting jaws rotatably above the stationary cavity member and to guide them laterally adjacent to the cavity members in such a way that the free ends of the pivoting jaws engage the movable cavity member from behind.

In an advantageous embodiment, a pivoting jaw, on which a plurality of lifting devices and locking means is provided, is arranged on each of two opposite sides of the cavity members. In this case, the two pivoting jaws expediently extend over the greater part of the length or the entire length of the cavity members, the lifting devices and locking means in this case being arranged alternately next to one another. The number of lifting devices and locking means depends on the size of the cavity members and the test pressure inside the cavity and there may be six to ten or more lifting devices and locking means per pivoting jaw.

In an alternative embodiment, at least two pivoting jaws are arranged on each of two opposite sides of the cavity members, adjacent pivoting jaws alternately comprising a lifting device or locking means. However, the number of pivoting jaws may vary widely, and may be substantially greater than this, in particular when tests are carried out at high pressure, for example there may be six to ten or more pivoting jaws on each side.

In an advantageous embodiment, the lifting device comprises a plunger, said plunger being guided in a support portion, which engages from behind the cavity member to be pressed, of the pivoting jaw and being movable in the pressing direction. A plunger of this type can be actuated in a variety of ways, for example by a lever mechanism which is pneumatically, hydraulically or electromechanically actuated.

In an advantageous embodiment, the plunger is functionally connected via a lever mechanism to a drive means arranged within the pivoting jaw. A drive means of this type is expediently formed from a pneumatically or hydraulically displaceable piston. In this case, all the movable elements of the lifting device are arranged within the associated pivoting jaw in such a way that it is only necessary to provide a fluid supply line between the movable pivoting jaw and the stationary environment.

In an advantageous embodiment, the locking means comprises a small spacer plate which can be inserted perpendicular to the pressing direction into the gap between the pivoting jaw and the cavity member. The locking means preferably comprises a driving toothed wheel which is mounted in or on the pivoting jaw and cooperates with a toothed rack portion of the small spacer plate. A locking means of this type can be produced in a relatively simple manner, requires little space and enables the pressed cavity member to be locked securely and mechanically in the pressed, tight position thereof.

In an advantageous embodiment, a counter-pressure member is fastened to each pivoting jaw and, in the closed position of the pivoting jaw, contacts the cavity member not contacted by the lifting devices in such a way that this cavity member is supported against the pressing force produced by the lifting devices. In this way, the pressing forces produced by the lifting devices and maintained by the locking means are absorbed by the counter-pressure members so it is not necessary to support the cavity member not contacted by the lifting devices using additional, separate devices.

Figure 2:
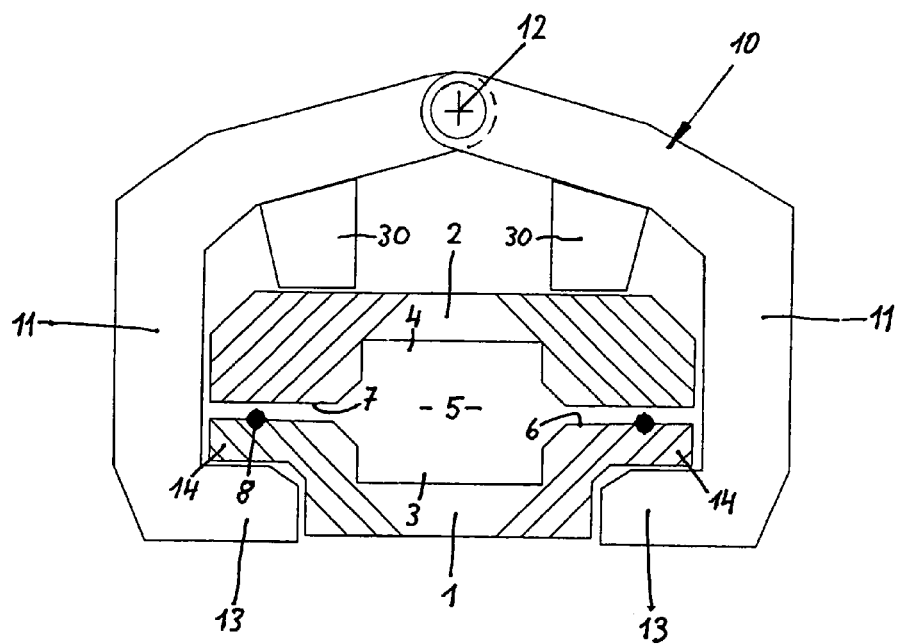
Figure 3:
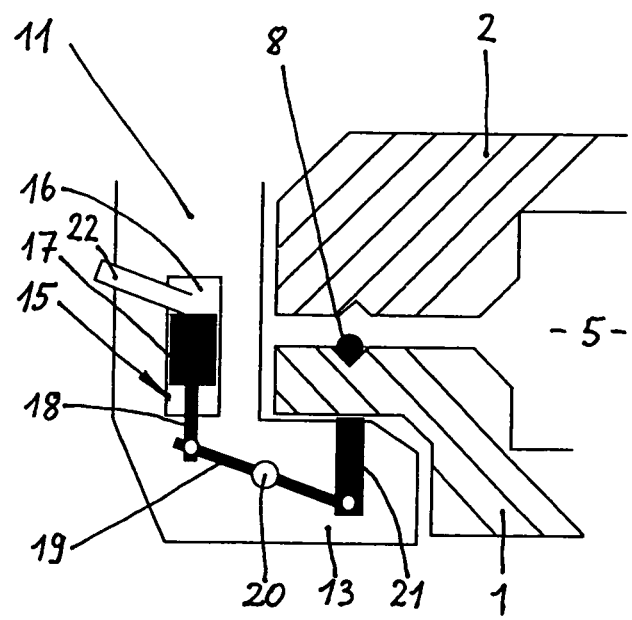
Figure 4:
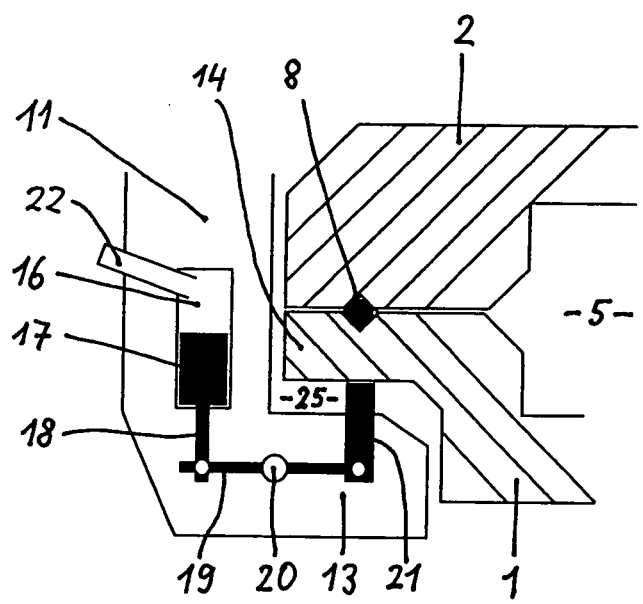
Figure 5:
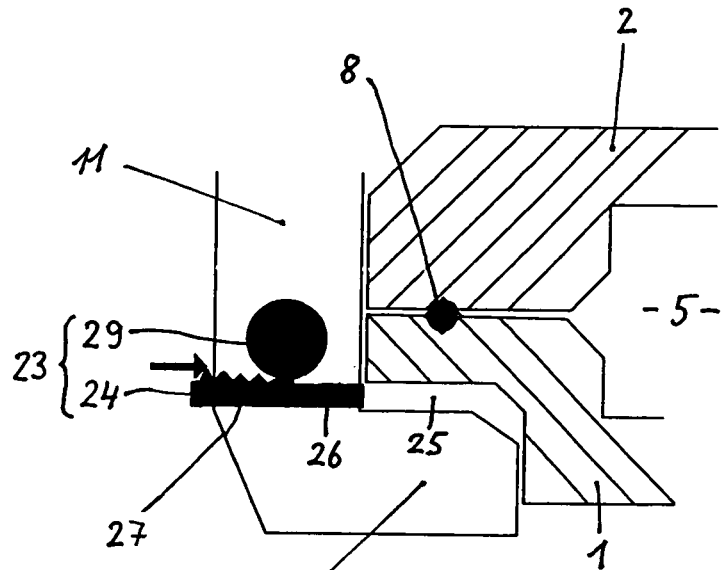
Figure 6:
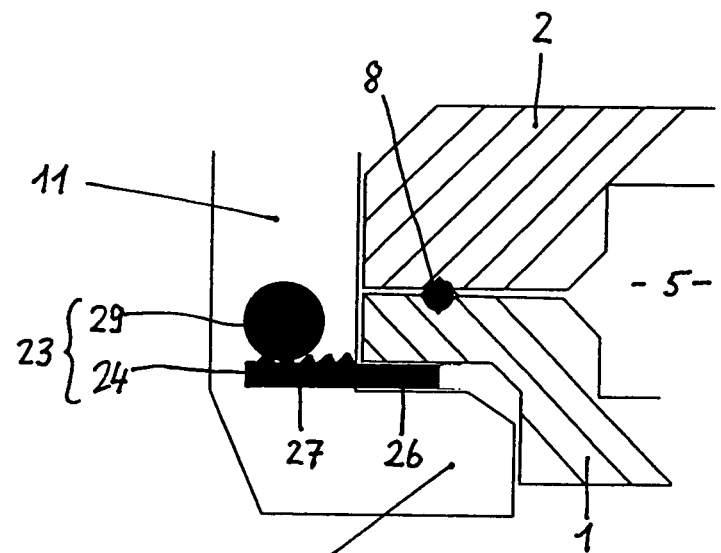
Figure 7:
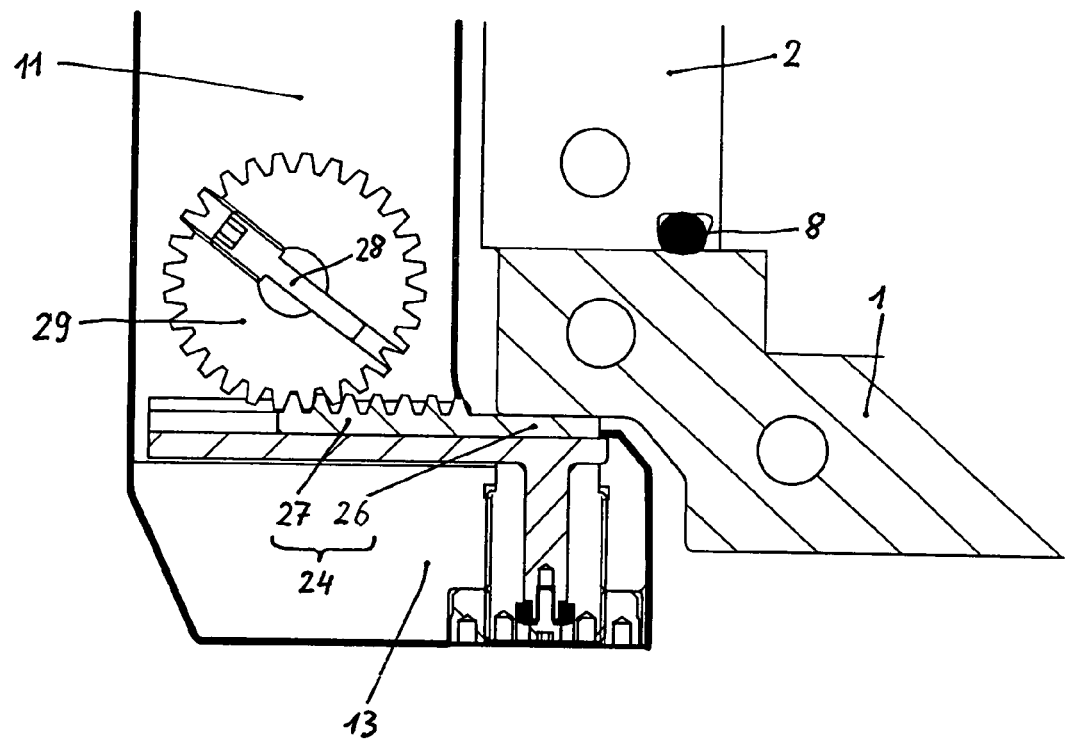

The invention is described in greater detail below by way of examples and with reference to the drawings, in which:

FIG. 1 is a schematic view, partially in section, of two cavity members with a closure mechanism according to the invention, the pivoting jaws being in an open position, FIG. 2 is a schematic view of the cavity members and the closure mechanism from FIG. 1, the pivoting jaws being in a closed position, FIG. 3 shows part of the cavity members and part of a pivot lever with a schematically illustrated lifting device, the lifting device being in a retracted starting position, FIG. 4 is a view corresponding to that of FIG. 3, the lifting device being in an advanced position, FIG. 5 is a schematic view of part of the cavity members and part of a pivoting jaw with a locking means in a retracted starting position, FIG. 6 is a view corresponding to that of FIG. 5, the locking means being in an advanced engagement position, and FIG. 7 is a more detailed view of the locking means from FIG. 6.

FIGS. 1 and 2 are schematic, simplified cross-sections through a first cavity member 1 and a second cavity member 2. In a plan view, the two cavity members 1, 2 are at least substantially rectangular. Provided in a central region of the first cavity members 1 is a recess 3 into which one or more electronic components (not shown) can be introduced when the first cavity member 1 is at a sufficient distance from the second cavity member 2.

Provided in a central region of the second cavity member 2 is a recess 4 which is located opposite the recess 3 of the first cavity member 1 and, together therewith, forms a closed cavity 5 when the first cavity member 1 is advanced towards the second cavity member 2.

The cavity members 1, 2 have mutually facing faces 6, 7 which are formed parallel to one another and are planar in the embodiment shown. Embedded in the face 6 of the cavity member 1 is a sealing ring 8 which extends around the recess 3 and projects above the face 6. When the first cavity member 1 is pressed against the second cavity member 2, the sealing ring 8 deforms elastically and seals the cavity 5.

In the region of the recess 4, the second cavity member 2 comprises electrical contacts (not shown) which are brought into contact with the components placed in the recess 3 when the two cavity members 1, 2 are brought together. In addition, air or gas lines (not shown) preferably open into the cavity 5, preferably via the cavity member 2, in order to produce a predetermined pressure at which the components are to be tested within the cavity, After the cavity member 1 is loaded, said cavity member is moved by a device (not shown) in the direction of the arrow 9, and therefore towards the second cavity member 2, which is held stationary, until it approaches the position shown in FIGS. 1 and 2 in which the sealing ring 8 is positioned adjacent to the face 7 of the cavity member 2. In this proximate position, the contacts of the components are not yet in contact with the opposite contacts of the second cavity member 2 but are in the direct vicinity thereof.

The drawings also show a closure mechanism 10, with which the lower cavity member 1 can be pushed from the proximate position shown in FIGS. 1 and 2 further towards the upper cavity member 2 until the sealing ring 8 is in tight contact with the cavity member 2 and the contacts of the components to be tested come into contact with the corresponding contacts of the upper cavity member 2.

This closure mechanism 10 has two opposing pivoting jaws 11 which encompass the two cavity members 1, 2 from opposite sides and press them together as described in greater detail below. In FIGS. 1 and 2, only two pivoting jaws 11, which are pivotable about a common horizontal pivot axis 12, are shown schematically. Alternatively, however, it is also possible for a plurality of pivoting jaws 11 to be arranged next to one another, preferably at a regular distance from one another, on both sides of the cavity members 1, 2 in order to distribute the pressing forces as uniformly as possible over the cavity members 1, 2. Furthermore, it is by no means necessary for the pivoting jaws 11 on the left and on the right to be pivotable about a common pivot axis 12. The pivoting jaws 11 on the left and on the right may instead each pivot about their own pivot axes, the two pivot axes in this case being arranged parallel with one another.

In the embodiment shown, the pivot axis 12 is located above the upper cavity member 2. The pivoting jaws 11 are formed so as to be C-shaped and extend downwards to the left and to the right from the pivot axis 12. The lower ends of the pivoting jaws 11 comprise supporting portions 13 which extend inwards, i.e. towards one another. When the pivot jaws 11 are pivoted apart, as shown in FIG. 1, the supporting portions 13 are at such a distance from one another that the cavity member 1 can be moved in the direction of the arrow 9 and back without striking the supporting portions 13. In contrast, when the pivoting jaws 11 are pivoted inwards, i.e. together, the supporting portions 13 engage the two opposite edge portions 14 of the lower cavity member 1 from behind when said lower cavity member is in the proximate position relative to the upper cavity member 1, as shown in FIGS. 1 and 2.

In order to press the lower cavity member 1 from this proximate position further against the upper cavity member 2, a plurality of identical lifting devices 15 are arranged in both the left-hand and right-hand pivoting jaws 11 along said pivoting jaws 11, only one of these lifting devices 15 being shown in FIGS. 4 and 5.

The lifting device 15 comprises a cylinder 16 which is arranged in the vertical portion of the pivoting jaw 11 and in which a pneumatically or hydraulically actuatable piston 17 can be moved back and forth. The piston rod 18 in the piston 17 is coupled to a pivot lever 19 which can be pivoted about a pivot axis 20. The opposing end of the pivot lever 19 is in turn coupled to a plunger 21 which is displaceably guided inside the support portion 13 of the pivoting jaw 11 and can be moved back and forth in the vertical direction. When the piston 17 is moved into the uppermost position thereof, as shown in FIG. 3, the plunger 21 is moved by the pivot lever 19 into its retracted position in which the upper end of the plunger 21 does not project or projects only slightly beyond the supporting portion 13. In any case, when the plunger 21 assumes this retracted position, it does not obstruct the pivoting movement of the pivoting jaw 11 from the open position into the closed position thereof, and vice versa.

When fluid is introduced into a cylinder 16 via a fluid line 22 the piston 17 moves into a lower position, as shown in FIG. 4. Consequently, the plunger 21 is advanced upwards via the pivot lever 19, thus coming into contact with the lower side of the edge portion 14 of the lower cavity member 1 and pushing the cavity member 1 upwards against the cavity member 2 until the sealing ring 8 is strongly compressed. In this position, the cavity 5 is completely sealed from the outside. In addition, the plungers 21 have a self-locking clamping effect which prevents the pivoting jaws 11 from opening unintentionally.

Both the left-hand and the right-hand pivoting jaws 11 have a plurality of identical mechanical locking means 23 which are arranged along the pivoting jaws 11 between the lifting devices 15 so that it is not necessary for the lifting devices 15 to apply high contact pressure during the entire test process. One of these locking means 23 is described in greater detail with reference to FIGS. 5 and 7.

Each locking means 23 comprises a small spacer plate 24 which can be inserted into the gap 25 between the lower side of the cavity member 1 pressed by the lifting devices 15 (FIG. 4) and the upper side of the support portions 13 of the pivoting jaws 11. The insertion direction of the small spacer plates 24 thus extends transverse to the cavity member 1 and therefore perpendicular to the direction of movement of the cavity member 1.

Each small spacer plate 24 has a front planar portion 26 and a rear toothed rack portion 27. The planar portion 26 is only slightly thinner than the height of the gap 25 (FIG. 4). The toothed rack portion 27 cooperates with a drive means which, in the embodiment shown, is composed of a driving toothed wheel 29 which can be rotated about an axis of rotation 28 (FIG. 7). By means of the driving toothed wheel 29, the small spacer plate 24 can be advanced from a rear retracted position, shown schematically in FIG. 5, into the gap 25 and thus into a locking position, shown schematically in FIG. 6. If the plungers 21 of the lifting devices 15 are now retracted, it is only possible for the lower cavity member 1 to move very slightly away from the upper cavity member 2 on account of the small spacer plates 24, the sealing ring 8 remaining sufficiently compressed to ensure the cavity 5 remains sealed as desired.

The small spacer plates 24 are also a mechanical clamping device preventing the pivoting jaws 11 from opening unintentionally.

In order to support the upper cavity member 2 against the contact pressure of the lower cavity member 1, each of the pivoting jaws 11 comprises a counter-pressure member 30, shown schematically in FIGS. 1 and 2. The counter-pressure members 30 are formed by support members which project downwards from an upper leg of the pivoting jaws 11 and come into contact with the upper side of the upper cavity member 2 when the pivoting jaws 11 are closed.

In this way, the pressing forces which act upon the upper cavity member 2 via the small spacer plates 24 and via the pressure inside the cavity 5 during the test can be absorbed by the counter-pressure members 30 and thus also by the pivoting jaws 11.

After completion of the test process, the pressure in the cavity 5 is reduced. The plungers 21 are subsequently advanced to press the lower cavity member 1 more strongly against the upper cavity member 2 temporarily to allow the small spacer plates 24 to be retracted into the position shown in FIG. 5 in which they do not project, or do not project to any substantial extent, inwards beyond the pivoting jaws 11. After the plungers 21 have been moved back into the retracted position, the pivoting jaws 11 can then be pivoted back outwards in an unobstructed manner into the open position shown in FIG. 1. It is now possible to lower the lower cavity member 1 downwards to enable the tested components to be removed and as yet untested components to be placed in the recess 3.

The invention claimed is:

1. Closure mechanism for pressure test chambers for testing electronic components, ICs, under specific pressure conditions, the pressure test chamber having first and second cavity members which can be brought into a converged position in which they enclose a cavity in a tight manner, comprising:
   a plurality of pivoting jaws which can be pivoted between a closed position and an open position,
   spacer members movable into a gap between the pivoting jaws and the first cavity member when the first and second cavity members are in the converged position, the spacer members being movable both relative to the plurality of pivoting jaws and relative to the cavity members when the cavity members are in the converged position,
   a locking arrangement structured to move the spacer members,
   at least a part of the pivoting jaws having at least one lifting device structured to advance towards the first cavity member by the pivoting jaws so as to press said first cavity member against the second cavity member by the lifting devices in the closed position of the pivoting jaws,
   at least a part of the pivoting jaws having at least one locking arrangement structured to move at least one of the spacer members into the gap between the pivoting jaws and the pressed first cavity member in such a way that the pressed first cavity member remains in the converged position even when the lifting device has been retracted,
   wherein the locking arrangement is configured to insert the one of the spacer members perpendicular to the pressing direction into the gap between the pivoting jaw and the first cavity member.

2. Closure mechanism according to claim 1, wherein the pivoting jaws are C-, L- or U-shaped.

3. Closure mechanism according to claim 1, wherein a pivoting jaw, on which a plurality of lifting devices and locking arrangement is provided, is arranged on each of two opposite sides of the cavity members.

4. Closure mechanism according to claim 1, wherein at least two pivoting jaws are arranged on each of two opposite sides of the cavity members, adjacent pivoting jaws alternately comprising a lifting device or locking arrangement.

5. Closure mechanism according to claim 1, wherein the lifting device comprises a plunger, said plunger being guided in a support portion, which engages from behind the first cavity member to be pressed, of the pivoting jaw and being movable in the pressing direction.

6. Closure mechanism according to claim 5, wherein the plunger is functionally connected via a lever mechanism to a drive means arranged within the pivoting jaw.

7. Closure mechanism according to claim 6, wherein the drive is formed from a pneumatically or hydraulically displaceable piston.

8. Closure mechanism according to claim 1, wherein the locking arrangement comprises a driving toothed wheel which is mounted in or on the pivoting jaw and cooperates with a toothed rack portion of the small spacer plate.

9. Closure mechanism according to claim 1, wherein a counter-pressure member is fastened to each pivoting jaw and, in the closed position of the pivoting jaw, contacts the second cavity member not contacted by the lifting devices in such a way that this second cavity member is supported against the pressing force produced by the lifting devices.

10. An integrated circuit test assembly comprising:
   plural cavity members that when engaged together define a sealed recess for accepting an electrical component, the sealed recess having electrical contacts therein for operating said accepted electrical component; and
   a closure mechanism comprising:
      pivoting jaws that pivotably engage and thereby force the cavity members together;
      an automatically-actuatable lifting device disposed on the pivoting jaws that applies force in a predetermined direction to press the cavity members together; and
      a spacer perpendicularly movable relative to the predetermined direction, the spacer structured to be movable into a gap defined between the pivoting jaws and the pressed cavity members, the spacer being structured to move both relative to the pivot jaws and relative to the cavity members, the moveable spacer penetrating into said gap when the cavity members are engaged together to thereby apply force against the cavity members to seal the recess and lock the closure mechanism.

* * * * *